United States Patent [19]

Liu

[11] Patent Number: 5,789,295
[45] Date of Patent: Aug. 4, 1998

[54] METHOD OF ELIMINATING OR REDUCING POLY1 OXIDATION AT STACKED GATE EDGE IN FLASH EPROM PROCESS

[75] Inventor: David Kuan-Yu Liu, Cupertino, Calif.

[73] Assignee: Advanced Micro Devices, Inc., Sunnyvale, Calif.

[21] Appl. No.: 559,082

[22] Filed: Nov. 17, 1995

[51] Int. Cl.⁶ .................................... H01L 21/8247
[52] U.S. Cl. .................................... 438/264; 438/923
[58] Field of Search ................ 437/43, 44, 49, 437/931; 148/DIG. 35; 438/257, 264, 923

[56] References Cited

U.S. PATENT DOCUMENTS 5,464,784  11/1995  Crisenza et al. ............... 437/43
5,510,284  4/1996   Yamauchi ...................... 437/43

*Primary Examiner*—Chandra Chaudhari
*Attorney, Agent, or Firm*—Fliesler, Dubb, Meyer & Lovejoy

[57] ABSTRACT

A gate stack formation process directed toward reducing floating gate oxidation which influences tunnel oxide thickness and, therefore, discharge speed. On a substrate upon which is formed an oxide layer, a first polysilicon layer, a dielectric layer, and a second polysilicon layer, only the second polysilicon layer and dielectric layer are etched. Source and drain regions are implanted through the first polysilicon layer. Subsequently, the first polysilicon layer is etched to form the full gate stack.

22 Claims, 4 Drawing Sheets

METHOD OF ELIMINATING OR REDUCING POLY1 OXIDATION AT STACKED GATE EDGE IN FLASH EPROM PROCESS

BACKGROUND OF THE INVENTION

1. Field of Invention

The invention relates to memory cells, and more particularly to stacked gate edge formation.

2. Description of Related Art

Memory devices are generally comprised of core cells (or devices) and periphery devices. The memory core cells typically store information while the memory periphery devices make the information accessible to circuitry outside the memory.

FIG. 1 shows a cross-section of a memory core device comprising a stacked gate structure 95, a source 20, a drain 30, and a substrate 10. The stacked gate structure 95 is composed of a tunnel oxide layer 40, a floating gate 50, a dielectric layer 60, and select gate 70.

Generally in memory technology, and particularly flash EPROM technology, a core cell (device) is programmed to store an information bit by placing charge (electrons) on the floating gate 50. To erase a cell, charge is removed from the floating gate 50.

Referring to FIG. 1, during a program operation, a voltage is applied to drain region 30, typically 3–6 volts, while source region 20 remains grounded, causing a current to flow from source to drain in channel region 25. A voltage of 9–12 v is then applied to gate 70, which causes electrons in channel region 25 to migrate across tunnel oxide 40 to floating gate 50. This method of programming is often referred to as "channel hot electron" programming, or CHE.

To erase the cell, Fowler-Nordheim tunneling is typically utilized. A voltage near 5 v is applied to source region 20 while a voltage of approximately −9 v to −12 v is applied to gate 70. Electrons will migrate from floating gate 50 to source region 20 in the area where floating gate 50 overlaps source region 20, thereby discharging the floating gate 50. The rate of discharge of the floating gate is highly dependent upon the overlap of the floating gate 50 over the source region 20 and the thickness of the oxide region 40 between the source region 20 and floating gate 50. A thinner oxide results in a faster discharge of the floating gate.

Conventional formation of an EPROM cell involves growing tunnel oxide layer 40, depositing a first polysilicon layer 50 (poly1), growing or depositing an oxide-nitride-oxide (ONO) dielectric layer 60, and depositing a second polysilicon layer 70 (poly2). The layers are etched to expose the full gate stack 95. Subsequently, source 20 and drain 30 regions are implanted, either separately (asymmetrically) or jointly (symmetrically), typically at energy levels near 50 keV to 60 keV to achieve a doped region thickness near 0.25 microns. The process also includes an oxidation step before implantation, typically forming a screening oxide to block impurities from reaching the substrate, as well as an oxidation and a diffusion step following implantation of the source 20 and drain 30 regions. These oxidation steps cause the poly1 layer 50 to partially oxidize, resulting in the undesirable "smile" of the poly1 sidewall, shown in FIG. 2. Oxidation of the poly1 layer 50 is further increased in areas of overlap with the doped source and drain regions caused by dopant enhanced oxidation. The poly1 oxidation increases the effective tunnel oxide thickness at the edge 55 of the stacked gate 95 in the source overlap area. This increase in the tunnel oxide thickness will result in a slow down of the erase (or discharge) speed. Additionally, because the amount of the poly1 portion of the gate which is oxidized will not be the same for each cell, erasing many cells at the same time becomes difficult because of variations in discharge time.

Therefore, it is desirable to have a process which effectively eliminates, or reduces, the oxidation of the poly1 layer at the stack gate edge and creates more uniformity in discharge rate among cells on a memory device.

SUMMARY OF THE INVENTION

The present invention, roughly described, is directed to floating gate device gate stack formation. Because oxidation steps in conventional processes increase the tunnel oxide region between the floating gate and source regions by causing oxidation of the floating gate, thereby influencing gate discharge speed, it is desirable to minimize oxidation of the floating gate during gate stack formation.

The process used to minimize oxidation of the floating gate begins with a substrate upon which field isolation regions have been formed. In the active regions of the substrate is formed an oxide layer, a first polysilicon layer over the oxide layer, a dielectric layer over the first polysilicon layer, and a second polysilicon layer. The second polysilicon layer and the dielectric layer are etched to form a partial gate stack. Source and drain regions are implanted through the first polysilicon layer and are subsequently diffused. The first polysilicon layer is then etched to form the full gate stack, following any other oxidation steps which may be required.

In addition to minimizing oxidation of the first polysilicon layer (floating gate), the process in accordance with the invention discourages variance in tunnel oxide thickness among devices on a memory which are formed simultaneously, permitting more uniform discharge speed among devices.

BRIEF DESCRIPTION OF THE DRAWINGS

The invention will be described with respect to particular embodiments thereof, and reference will be made to the drawings, in which.

DETAILED DESCRIPTION OF INVENTION

In accordance with the invention, a method of forming a floating gate device is disclosed which significantly reduces and/or eliminates oxidation of the poly1 layer of the stacked gate. As a result of using the method in accordance with the invention, the thickness of the tunnel oxide layer can be better controlled, resulting in more predictable erase (discharge) speeds. Further, in a memory device composed of core cells (floating gate devices) and periphery devices, substantial benefits can be had in uniformity of the discharge speed in core cells formed using the method in accordance with the invention.

Figure 1:
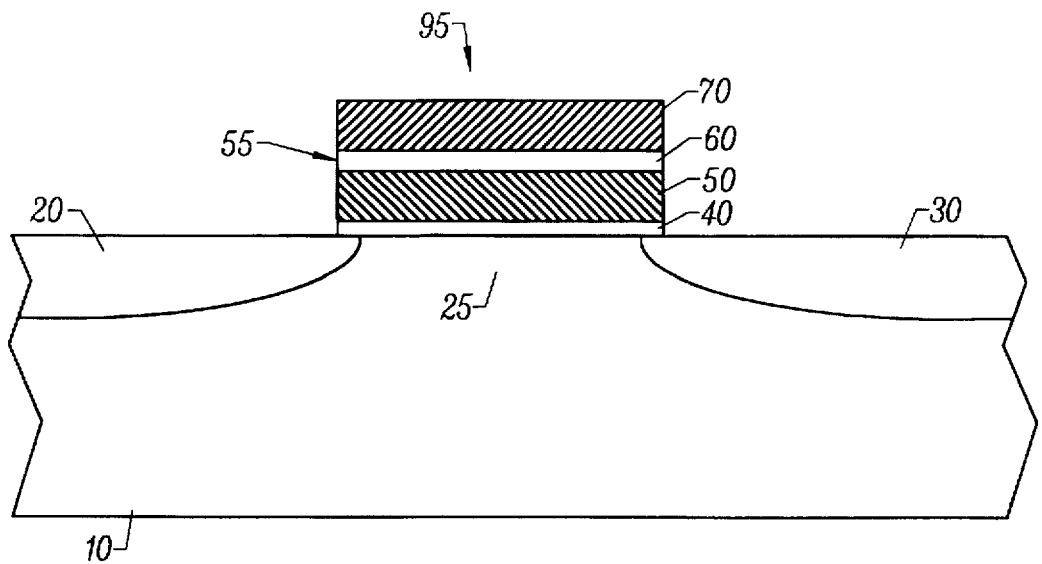
FIG. 1 is a cross-sectional view of a floating gate device.
Figure 2:
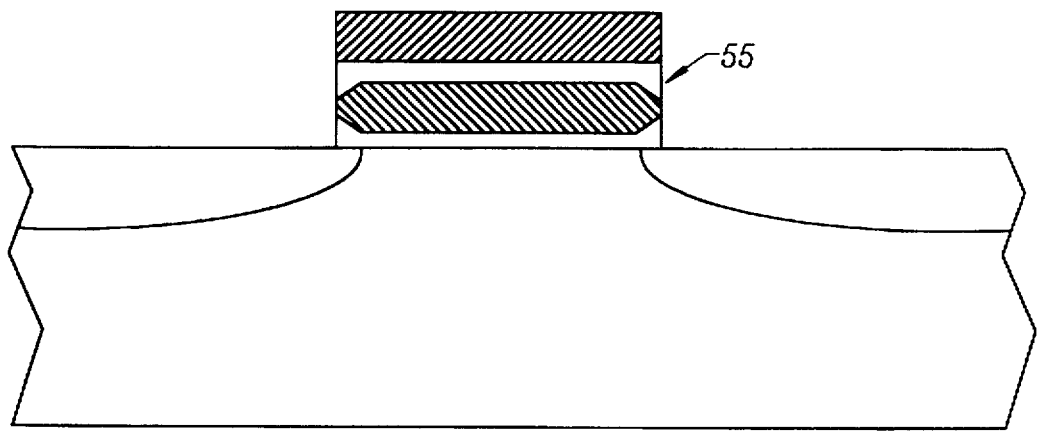
FIG. 2 is a cross-sectional view of a floating gate device formed using conventional techniques with resulting poly1 "smile"
Figure 3:
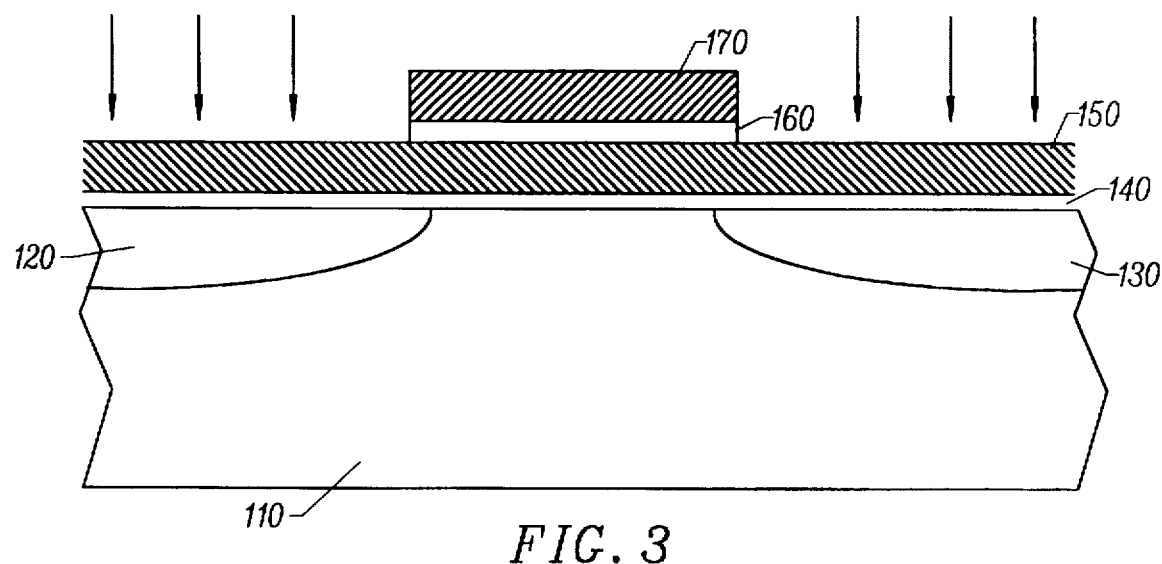
FIG. 3 is a cross-sectional view of a partially formed floating gate device being formed utilizing a process in accordance with the present invention.

Conventionally, when forming the stacked gate structure of a floating gate device, the poly2 layer is first patterned and etched. The remaining poly2 layer is then used as a mask for etching away the dielectric, poly1, and tunnel oxide layers, and subsequently the source and drain regions are implanted. However, it is possible to perform ion implantation through polysilicon layers with thicknesses less than 1000 Å. Therefore, there is no need to immediately etch the poly1 layer after etching the poly2 layer. Once the poly2 layer is patterned, source and drain regions can still be implanted in a self-aligned fashion regardless of the presence of the poly1 layer, as shown in FIG. 3.

Thus, in accordance with the invention, poly1 layer 150 is patterned and etched to form the full gate stack subsequent to implanting source region 120 and drain region 130, and subsequent to most other oxidation cycles in the process. Therefore, because poly1 layer 150 is not etched until after most oxidation steps, oxidation of poly1 layer 150 will be minimized, thereby minimizing any slow-down in discharge speed due to thicker tunnel oxide in the floating gate source overlap region.

Figure 4:
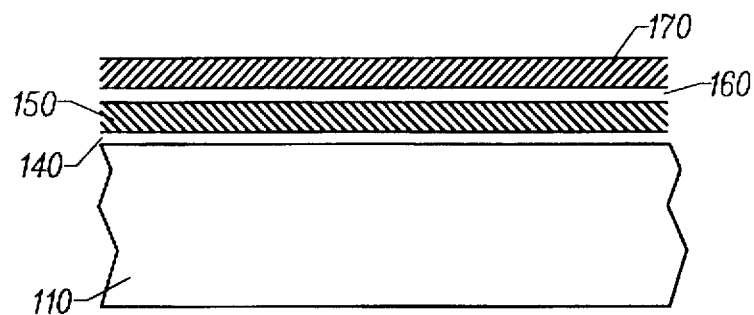
FIG. 4 is a cross-sectional view of a partially formed floating gate device being formed utilizing a process in accordance with the present invention.

Specifically, the process in accordance with the invention is initiated by providing substrate 110 shown in FIG. 4. A tunnel oxide layer 140 of approximately 80–100 Å is grown on top of the substrate, typically by heating the substrate and exposing it to an ambient oxidant, either wet or dry, at a temperature in the range of 800°–1000° C., for a given period of time depending upon the thickness of the layer desired. A polysilicon layer (poly1 layer) 150, is then deposited over oxide layer 140, using, for example, conventional chemical vapor deposition (CVD) techniques to achieve a thickness in a range of about 800–1500 Å. Next, an oxide-nitride-oxide (ONO) dielectric layer 160 is grown or deposited over poly1 layer 150. A second polysilicon layer (poly2 layer) 170, is then deposited over dielectric layer 160.

Figure 5:
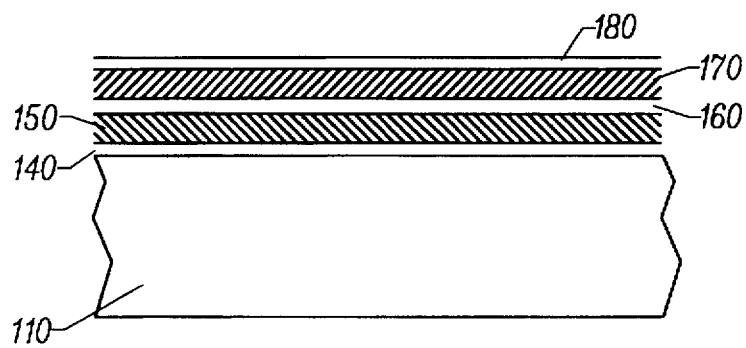
FIG. 5 is a cross-sectional view of a partially formed floating gate device being formed utilizing a process in accordance with the present invention.

In one embodiment in accordance with the invention, an etch stop layer 180 is grown or deposited over poly2 layer 170, as shown in FIG. 5. The etch stop layer may be composed of oxide, nitride, or another suitable material.

Figure 6:
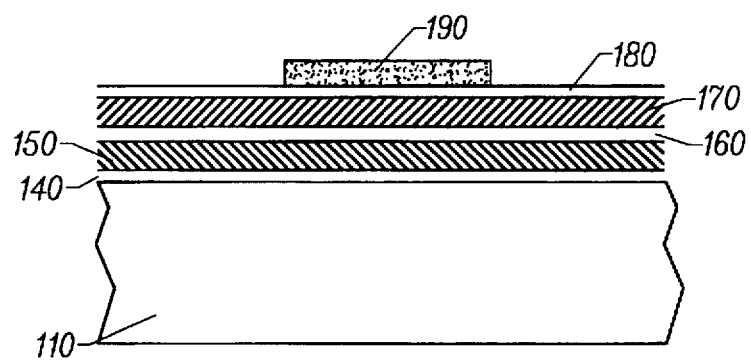
FIG. 6 is a cross-sectional view of a partially formed floating gate device being formed utilizing a process in accordance with the present invention.

A conventional photoresist process is then utilized to form gate mask 190, shown in FIG. 6. A photoresist layer is deposited over etch stop layer 180, and then portions of the photoresist layer are exposed to ultraviolet light. Depending on the type of photoresist, the exposed or unexposed portions of the photoresist layer are removed, forming gate mask 190.

Figure 7:
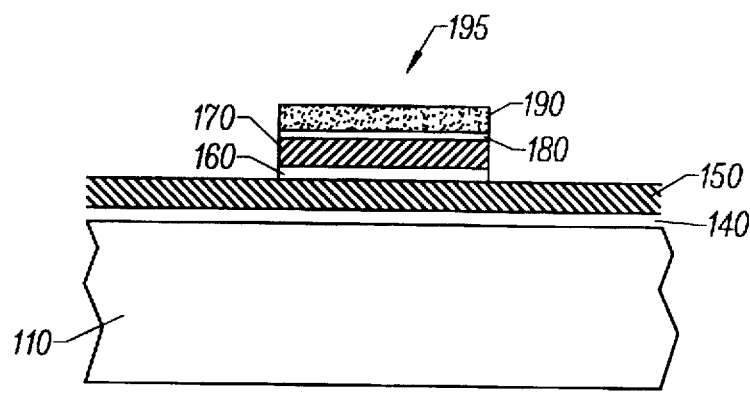
FIG. 7 is a cross-sectional view of a partially formed floating gate device being formed utilizing a process in accordance with the present invention.

Partial stack 195, shown in FIG. 7, is then formed. Etch stop layer 180 is etched using, for example, a reactive ion etch, which is an anisotropic highly selective etch, and portions of etch stop layer 180 are completely removed to expose the underlying poly2 layer 170, leaving a portion of etch stop layer 180 underneath gate mask 190. If etch stop layer 180 is composed of oxide, the etch would additionally be a highly selective anisotropic oxide etch. Poly2 layer is then etched in a similar manner, but using an anisotropic highly selective silicon etch. Similarly, ONO dielectric layer 150 is etched using an anisotropic highly selective oxide etch process, exposing the underlying poly1 150 layer.

Figure 8:
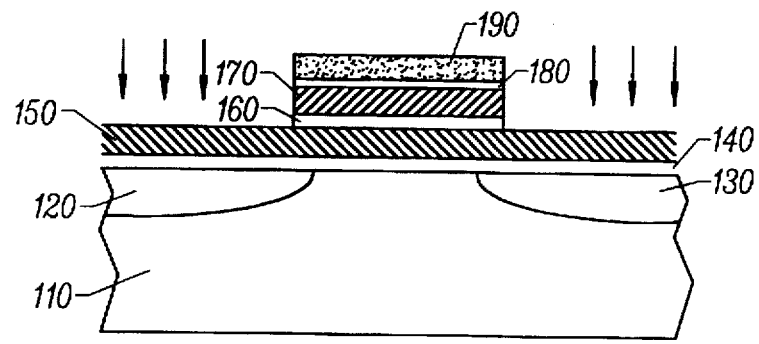
FIG. 8 is a cross-sectional view of a partially formed floating gate device being formed utilizing a process in accordance with the present invention.
Figure 9:
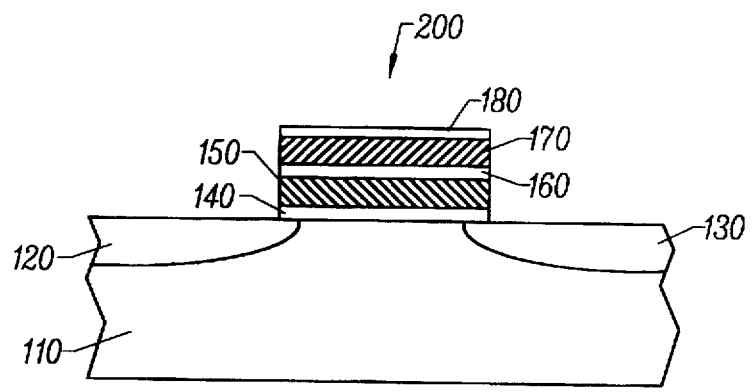
FIG. 9 is a cross-sectional view of a partially formed floating gate device being formed utilizing a process in accordance with the present invention.

Shown in FIG. 8, source region 120 and drain region 130 are implanted with a doping material, such as arsenic, at 80 keV to 150 keV. Higher energy is required to implant the source and drain regions in a process in accordance with the invention over that used conventionally (approximately 50–60 keV) because the doping material must penetrate a larger thickness (the poly1 and tunnel oxide layers).

In addition, in one embodiment in accordance with the invention, a screening oxide may also be formed over the poly1 layer 150 and partial stack 195 prior to implanting the source region 120 and drain region 130. Such a screening oxide layer (not shown) is conventionally used to inhibit impurities from depositing in the substrate. However, because poly1 layer 150 acts as a partial screen, such a screen oxide layer is not necessary to the process in accordance with the invention.

Subsequently, resist gate mask 190 is stripped and source and drain regions 120 and 130, are diffused to form an overlapping region with the partial gate stack 195, which is typically accomplished at high temperatures using conventional methods.

A poly1 etch is then performed, using a highly selective anisotropic silicon etch process to remove portions of poly1 layer 150 to form full gate stack 200. Etch stop layer 180 is important to this stage of the process in that it prevents poly2 layer 170 from being etched to a smaller size than desired. Alternatively, a new gate mask can be applied, however, this method risks misalignment. Etch stop layer 180 is then subsequently removed.

The process in accordance with the invention and described above can also improve overall memory performance. In memory devices having core cells and periphery devices, core devices are conventionally formed first and then periphery devices are formed. However, periphery device formation entails multiple oxidation steps, which increases further tunnel oxide thickness in core devices over and above the oxidation caused by the core device formation itself. However, in accordance with the invention, core devices are formed up until the point preceding poly1 layer etching. Periphery devices are then formed, and subsequently, core cell devices are completed by etching the poly1 layer. Thus, oxidation steps performed in periphery device formation will have little, if any, effect on the tunnel oxide thickness in core devices, since the poly1 layer is not etched until after periphery device formation. Therefore, the process in accordance with the invention encourages uniformity in discharge speed among memory core devices because poly1 layers will not be oxidized, causing little variance in tunnel oxide thickness among memory core cells.

The invention has been described with respect to particular embodiments thereof, and it will be understood that numerous modifications are possible within the scope of the invention as set forth in the claims.

What is claimed is:

1. A method of forming a floating gate device on a substrate having a tunnel oxide layer over said substrate, a first polysilicon layer over said tunnel oxide layer, a dielectric layer over said first polysilicon layer, and a second polysilicon layer over said dielectric layer, comprising the sequential steps of:

(a) forming a partial gate stack having a first sidewall and a second sidewall by removing first portions of said second polysilicon layer and first portions of said dielectric layer underlying said first portions of said second polysilicon layer;

(b) forming a source region and a drain region in said substrate; and (c) removing, after said step (b), first portions of said first polysilicon layer to form a gate stack first polysilicon layer having a first side edge substantially in alignment with said first sidewall and a second side edge substantially in alignment with said second sidewall, thereby minimizing oxidation of said gate stack first polysilicon layer.

2. The method of claim 1, wherein step (b) includes diffusing said source and drain regions.

3. The method of claim 1, wherein:

in step (a), removing first portions of said second polysilicon layer includes etching with a highly selective, anisotropic polysilicon etch process;

in step (a), removing first portions of said dielectric layer includes etching with a highly selective, anisotropic oxide etch process; and in step (c), removing first portions of said first polysilicon layer includes etching with a highly selective, anisotropic polysilicon etch process.

4. The method of claim 1, wherein said floating gate device is a memory core cell, further comprising the step, preceding step (c), of forming a memory periphery device.

5. A method of forming a floating gate device comprising the sequential steps of:

(a) providing a substrate;

(b) forming a tunnel oxide layer over said substrate;

(c) forming a first polysilicon layer over said tunnel oxide layer;

(d) forming a dielectric layer over said first polysilicon layer;

(e) forming a second polysilicon layer over said dielectric layer;

(f) forming a partial gate stack having a first sidewall by removing first portions of said second polysilicon layer and first portions of said dielectric layer underlying said first portions of said second polysilicon layer;

(g) forming a source region and a drain region in said substrate; and (h) removing first portions of said first polysilicon layer to form a gate stack first polysilicon layer having a first side edge substantially in alignment with first sidewall and a second side edge substantially in alignment with said second sidewall, thereby minimizing oxidation of said gate stack first polysilicon layer.

6. The method of claim 5, further comprising the step, preceding step (f), of forming an etch-stop layer over said second polysilicon layer.

7. The method of claim 6, wherein step (f) further includes removing first portions of said etch-stop layer to form a gate stack etch-stop layer having a first edge substantially in alignment with said first sidewall and a second edge substantially in alignment with said second sidewall.

8. The method of claim 5, wherein step (g) includes diffusing said source and drain regions.

9. The method of claim 5, wherein steps (d)–(f) form a partial gate stack, further comprising the step, preceding step (g), of forming a screening oxide layer on said partial gate stack.

10. The method of claim 5, wherein:

in step (f), removing first portions of said second polysilicon layer includes etching with a highly selective, anisotropic polysilicon etch process;

in step (f), removing first portions of said dielectric layer includes etching with a highly selective, anisotropic oxide etch process; and in step (h), removing first portions of said first polysilicon layer includes etching with a highly selective, anisotropic polysilicon etch process.

11. The method of claim 5, further comprising the step, preceding step (f), of forming a gate mask over a second portion of said second polysilicon layer.

12. The method of claim 5, wherein said floating gate device is a memory core cell, further comprising the step, preceding step (h), of forming a memory periphery device.

13. A method of forming a floating gate device comprising the sequential steps of:

(a) providing a substrate;

(b) forming a tunnel oxide layer over said substrate;

(c) forming a first polysilicon layer over said tunnel oxide layer;

(d) forming a dielectric layer over said first polysilicon layer;

(e) forming a second polysilicon layer over said dielectric layer;

(f) forming a gate mask over a stack portion of said second polysilicon layer, said gate mask having a first edge and a second edge;

(g) forming a partial gate stack having a first sidewall substantially in alignment with said first edge of said gate mask and a second sidewall substantially in alignment with said second edge of said gate mask by removing non-stack portions of said second polysilicon layer, and non-stack portions of said dielectric layer underlying said non-stack portions of said second polysilicon layer, exposing non-stack portions of said first polysilicon layer;

(h) completely forming a source region and a drain region in said substrate through said first polysilicon layer, including performing all implant and diffusion steps necessary to form said source and drain regions;

(i) minimizing oxidation of gate stack first polysilicon layer by removing said non-stack portions of said first polysilicon layer to form a gate stack first polysilicon layer having a first side edge substantially in alignment with said first sidewall and a second side edge substantially in alignment with said second sidewall.

14. The method of claim 13, further comprising the step, preceding step (f), of forming an etch-stop layer over said second polysilicon layer.

15. The method of claim 14, wherein step (g) further includes removing non-stack portions of said etch-stop layer, such that stack portions of said etch-stop layer remain under said gate mask.

16. The method of claim 13, wherein steps (d)–(g) form a partial gate stack, further comprising the step, preceding step (h), of forming a screening oxide layer on said partial gate stack.

17. The method of claim 13, wherein:

in step (g), removing non-stack portions of said second polysilicon layer includes etching with a highly selective, anisotropic polysilicon etch process;

in step (g), removing non-stack portions of said dielectric layer includes etching with a highly selective, anisotropic oxide etch process; and in step (i), removing non-stack portions of said first polysilicon layer includes etching with a highly selective, anisotropic polysilicon etch process.

18. The method of claim 13, wherein said floating gate device is a memory core cell, further comprising the step, preceding step (i), of forming a memory periphery device.

19. A method of forming a floating gate device comprising the sequential steps of:

(a) providing a substrate;

(b) growing a tunnel oxide layer over said substrate;

(c) depositing a first polysilicon layer over said tunnel oxide layer;

(d) depositing an oxide-nitride-oxide dielectric layer over said first polysilicon layer;

(e) depositing a second polysilicon layer over said oxide-nitride-oxide dielectric layer;

(f) depositing an oxide etch-stop layer over said second polysilicon layer;

(g) applying a photoresist layer over said oxide etch-stop layer;

(h) removing portions of said resist layer to form a gate mask and expose non-stack portions of said oxide etch-stop layer, said gate mask having a first edge and a second edge;

(i) etching said oxide etch-stop layer to remove said non-stack portions of said oxide etch-stop layer such that stack portions of said oxide etch-stop layer remain under said gate mask, exposing non-stack portions of said second polysilicon layer;

(j) etching said second polysilicon layer to remove said exposed non-stack portions of said second polysilicon layer such that stack portions of said second polysilicon layer remain under said gate mask, exposing non-stack portions of said oxide-nitride-oxide dielectric layer;

(k) etching said oxide-nitride-oxide dielectric layer to remove said exposed non-stack portions of said oxide-nitride-oxide dielectric layer such that stack portions of said oxide-nitride-oxide dielectric layer remain under said gate mask, exposing non-stack portions of said first polysilicon layer said stack portions of said oxide etch-stop layer, said second polysilicon layer, and said oxide-nitride-oxide dielectric layer forming a partial gate stack having a first sidewall substantially in alignment with said first edge of said gate mask and said partial gate stack having a second sidewall substantially in alignment with said second edge of said gate mask;

(l) completely forming a source region and a drain region including implanting ions through said first polysilicon layer and diffusing said source and drain regions;

(m) etching said first polysilicon layer to remove said non-stack portions of said first polysilicon layer such that stack portions said first polysilicon layer remain under said partial stack, said stack portions of said first polysilicon layer having a first edge substantially in alignment with said first sidewall and having a second edge substantially in alignment with said second sidewall.

20. The method of claim 19 wherein steps (i) and (k) include etching with a highly selective, anisotropic oxide etch process.

21. The method of claim 19 wherein steps (j) and (m) include etching with a highly selective, anisotropic polysilicon etch process.

22. The method of claim 19, wherein said floating gate device is a memory core cell, further comprising the step, preceding step (m), of forming a memory periphery device.

* * * * *

UNITED STATES PATENT AND TRADEMARK OFFICE
CERTIFICATE OF CORRECTION

PATENT NO. : 5,789,295
DATED : August 4, 1998
INVENTOR(S) : Liu

It is certified that error appears in the above-indentified patent and that said Letters Patent is hereby corrected as shown below:

Column 5, line 41: after "sidewall" insert -- and a second sidewall --

Column 5, line 50: after "with" insert -- said --

Signed and Sealed this

Eighth Day of December, 1998

Attest:

BRUCE LEHMAN

Attesting Officer

*Commissioner of Patents and Trademarks*